(12) United States Patent
Lau et al.

(10) Patent No.: US 10,770,319 B2
(45) Date of Patent: Sep. 8, 2020

(54) EPI THICKNESS TUNING BY PULSE OR PROFILE SPOT HEATING

(71) Applicant: Applied Materials, Inc., Santa Clara, CA (US)

(72) Inventors: Shu-Kwan Danny Lau, Sunnyvale, CA (US); Zhiyuan Ye, San Jose, CA (US); Zuoming Zhu, Sunnyvale, CA (US); Nyi O. Myo, San Jose, CA (US); Errol Antonio C. Sanchez, Tracy, CA (US); Schubert S. Chu, San Francisco, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/273,902

(22) Filed: Feb. 12, 2019

(65) Prior Publication Data

US 2019/0267263 A1     Aug. 29, 2019

Related U.S. Application Data

(60) Provisional application No. 62/634,693, filed on Feb. 23, 2018.

(51) Int. Cl.
*H01L 21/67* (2006.01)
*H01L 21/687* (2006.01)
*B23K 26/0622* (2014.01)

(52) U.S. Cl.
CPC .... *H01L 21/67115* (2013.01); *B23K 26/0622* (2015.10); *H01L 21/67248* (2013.01); *H01L 21/68742* (2013.01); *H01L 21/68792* (2013.01)

(58) Field of Classification Search
CPC ......... H01L 21/67115; H01L 21/68792; H01L 21/67248; H01L 21/68742; B23K 26/0622
See application file for complete search history.

(56) References Cited

U.S. PATENT DOCUMENTS 5,264,918 A     11/1993  Kagami
6,518,547 B2 *  2/2003   Takahashi ......... H01L 21/67115
                                              118/50.1

(Continued)

FOREIGN PATENT DOCUMENTS

JP    2002-093724 A    3/2002
TW       201212126 A    3/2012
TW       201802868 A    1/2018

OTHER PUBLICATIONS

International Search Report and Written Opinion dated Jun. 12, 2019 for Application No. PCT/US2019/017598.

(Continued)

*Primary Examiner* — Nahida Sultana
(74) *Attorney, Agent, or Firm* — Patterson + Sheridan, LLP

(57) ABSTRACT

Embodiments described herein provide processing chambers that include an enclosure for a processing volume, a rotatable support within the enclosure, the support having a shaft that extends outside the enclosure, wherein the shaft has a signal feature located outside the processing volume, an energy module within the enclosure, wherein the shaft extends through the energy module, one or more directed energy sources coupled to the enclosure, and one or more signalers positioned proximate to the signal feature, each signaler coupled to at least one of the directed energy sources.

20 Claims, 9 Drawing Sheets

(56) References Cited

U.S. PATENT DOCUMENTS

| | | | |
|---|---|---|---|
| 7,630,118 B2* | 12/2009 | Onvlee | G02B 26/0841 |
| | | | 359/290 |
| 8,772,055 B1* | 7/2014 | Ranish | H01L 21/67115 |
| | | | 438/5 |
| 10,409,306 B2* | 9/2019 | Ranish | G05D 23/27 |
| 10,541,182 B2* | 1/2020 | Kim | H01L 22/20 |
| 2004/0134264 A1* | 7/2004 | Massie | G01Q 70/02 |
| | | | 73/105 |
| 2015/0092813 A1 | 4/2015 | Timans | |
| 2017/0103907 A1 | 4/2017 | Chu et al. | |
| 2018/0010243 A1 | 1/2018 | Lee et al. | |

OTHER PUBLICATIONS

Office Action for Taiwan Application No. 108104880 dated Feb. 17, 2020.
Search Report for Taiwan Application No. 108104880 dated Feb. 15, 2020.

* cited by examiner

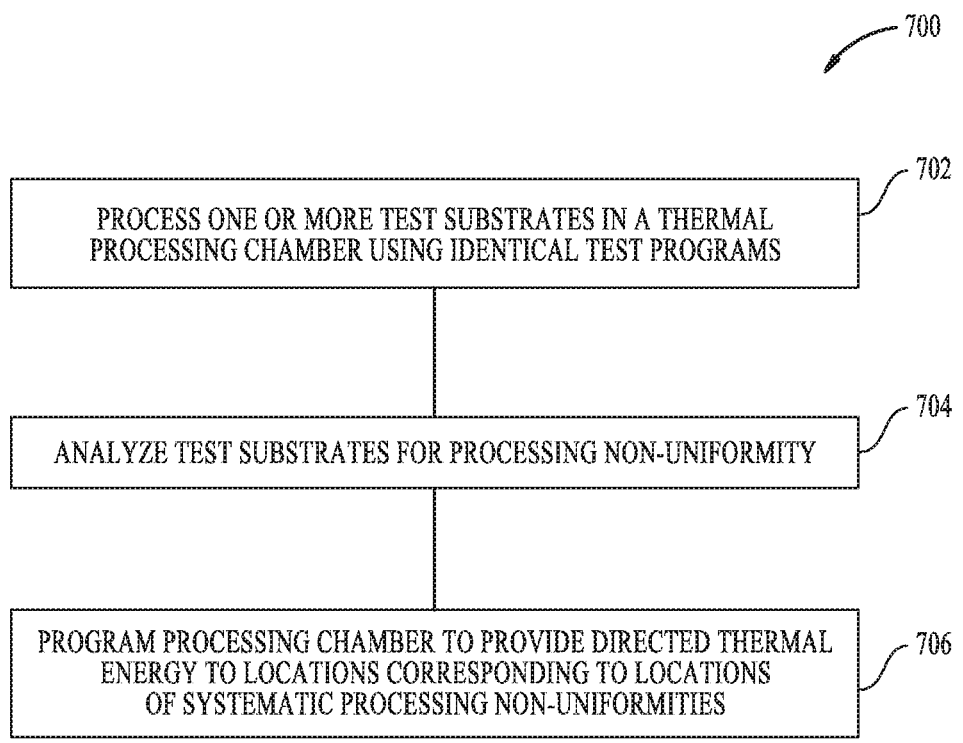

EPI THICKNESS TUNING BY PULSE OR PROFILE SPOT HEATING

CROSS-REFERENCE TO RELATED APPLICATIONS

This application claims benefit of U.S. provisional patent application No. 62/634,693, filed Feb. 23, 2018, the entirety of which is herein incorporated by reference.

BACKGROUND

Field

Embodiments of the present disclosure generally relate to a thermal processing chamber with controllable heating. Specifically, the thermal processing chambers described herein have directed energy sources configured to heat specific locations of a substrate disposed in the chambers for processing thereof.

Description of the Related Art

Thermal processing is commonly used to change the properties of an item. In semiconductor manufacturing, a substrate may be subjected to thermal processing to change the atomic structure of the substrate, to facilitate deposition of a material on the substrate, and/or to remove, or facilitate removal of, a material from the substrate. To the extent the thermal process is sensitive to the temperature of the thermal process, temperature non-uniformity on the substrate during processing can lead to non-uniformity in process results. For example, if a material is deposited on a substrate during thermal processing, the rate of deposition may depend on the local temperature of the substrate or at a location near the substrate surface. Differences in the deposition rate may lead to differences in a thickness of the material deposited across the substrate, which can lead to unacceptable non-uniformity in the functionality of devices formed on the substrate.

Temperature non-uniformities on the substrate during processing can arise from thermal and optical properties of various structures in the processing chamber, such as different objects and surfaces with different thermal and optical properties and different orientations within the processing environment of the chamber. Other sources of processing non-uniformity may also impact the result of the process. In processing systems with circular or cylindrical geometry, non-uniformities can have radial patterns and/or azimuthal patterns. Radial patterns of non-uniformity are typically addressed by heating adjustments in radial zones. Addressing azimuthal patterns arising from discrete chamber structures, such as substrate support and transportation structures, is more challenging.

As device geometries continue to decline, the uniformity of semiconductor processes become more demanding. Nano-scale non-uniformities are increasingly problematic at advanced dimension nodes. There are continuing needs for processing apparatus and methods which reduce processing non-uniformity in thermal processing chambers.

SUMMARY

Embodiments described herein provide a processing chamber, comprising an enclosure for a processing volume; a rotatable support within the enclosure, the support having a shaft that extends outside the enclosure, wherein the shaft has a signal feature located outside the processing volume; an energy module within the enclosure, wherein the shaft extends through the energy module; one or more directed energy sources coupled to the enclosure; and one or more signalers positioned proximate to the signal feature, each signaler coupled to at least one of the directed energy sources.

Other embodiments described herein provide a processing chamber, comprising an enclosure for a processing volume; a rotatable support within the enclosure, the support having a shaft that extends outside the enclosure, an energy module within the enclosure, wherein the shaft extends through the energy module; a rotation actuator coupled to the shaft; a directed energy source coupled to the enclosure; and a controller coupled to the rotation actuator and the directed energy source, the controller configured to synchronize rotation of the support with operation of the directed energy source.

Other embodiments described herein provide a processing chamber, comprising an enclosure for a processing volume; a rotatable support within the enclosure, the support having a shaft that extends outside the enclosure, wherein the shaft has a plurality of signal features; an energy module within the enclosure, wherein the shaft extends through the energy module; one or more directed energy sources coupled to the enclosure; one or more signalers positioned proximate to the signal features; and a controller coupled to the one or more signalers and to the one or more directed energy sources.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 7 is a flow diagram summarizing a method according to yet another embodiment.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Disclosed herein is a processing chamber including an enclosure for a processing volume. A rotatable support is disposed within the enclosure. The support has a shaft that extends to the exterior of the enclosure. An energy module is disposed within the enclosure. A directed energy source is coupled to the enclosure. The processing chamber also includes signaling and activation equipment for synchronizing activation of the directed energy source with rotation of the support. In the processing chamber described herein, the directed energy source is pulsed in synchronization with the rotation of the support to provide azimuthally localized spot heating of a substrate disposed on the support in order to address thermal non-uniformities with azimuthal patterns. Thus, the processing chamber has the capability to compensate, during processing, for substrate thermal non-uniformity that has an azimuthal component.

Figure 1:
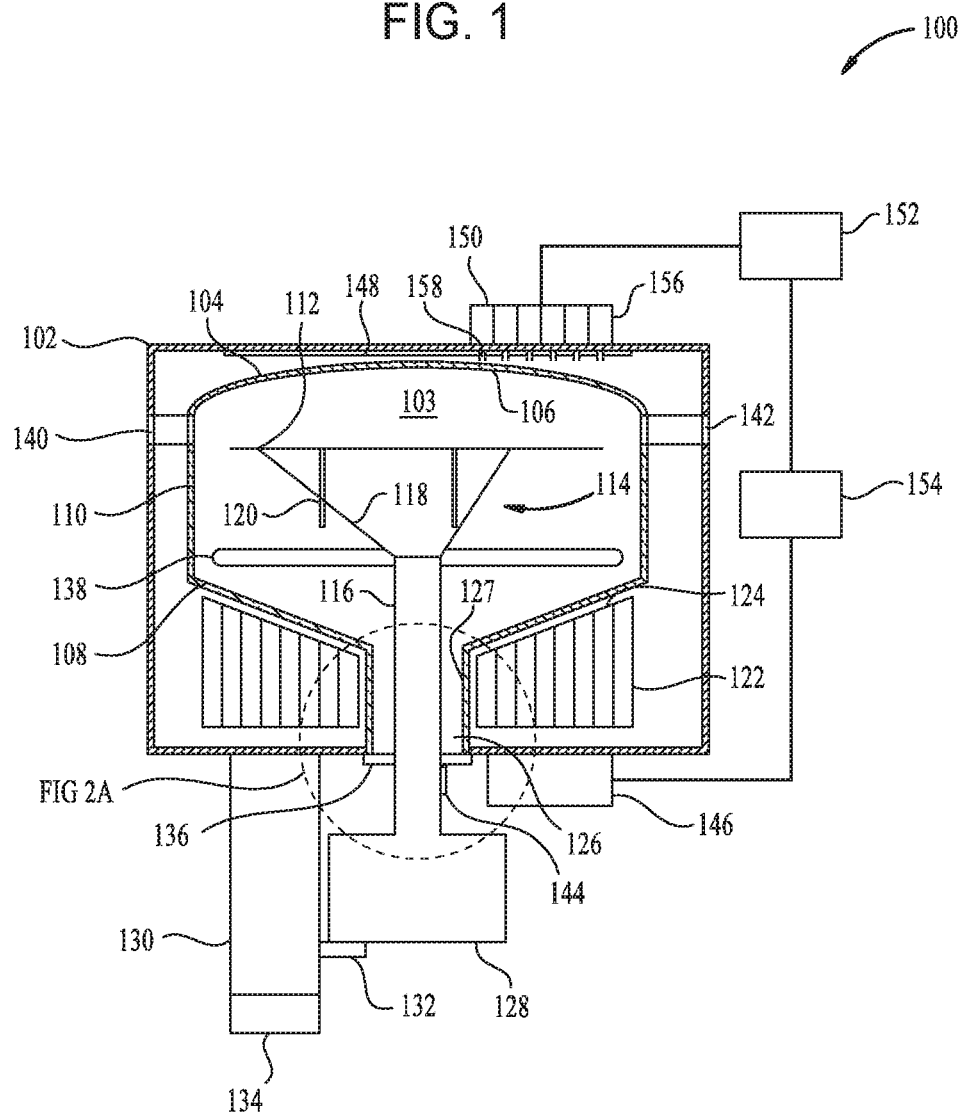
FIG. 1 is a schematic sectional side view of a processing chamber according to one embodiment.

FIG. 1 is a schematic side view of a processing chamber 100 according to one embodiment. The processing chamber 100 has an enclosure 102 for a processing volume 103, which may be defined by the enclosure 102 or by an inner enclosure 104. The inner enclosure 104 of FIG. 1 is defined by a first portion 106, a second portion 108, and a third portion 110 that joins the first portion 106 with the second portion 108 to define the processing volume 103. The first portion 106 and the second portion 108 are made of materials that transmit radiation of selected wavelengths, as described further below.

A susceptor 112 is included for supporting a substrate thereon during processing. The susceptor 112 is disposed in the processing volume 103, for example within the inner enclosure 104, and within the enclosure 102. The susceptor 112 supports a substrate during processing and absorbs radiation transmitted through the second portion 108 which heats the susceptor 112. The heat absorbed by the susceptor 112 is conducted through contact with the substrate or through gas between the susceptor 112 and the substrate, or is radiated to the substrate from the susceptor 112. In some cases, the susceptor 112 includes protrusions (not shown) that elevate the substrate above the surface of the susceptor 112. The susceptor 112 is shown in FIG. 1 as a disk-like member, but in some embodiments, the susceptor 112 may be a ring shaped support that contacts only the edge of the substrate.

The susceptor 112 is typically made of a material that absorbs a first spectrum of radiation, for example primarily visible light, and emits a second spectrum of radiation different from the first spectrum, for example primarily infrared radiation, for processing a substrate disposed on the susceptor. The susceptor may be configured of a material such as quartz, graphite, silicon, or silicon carbide, or a mixture thereof, and may be coated with any of those materials. In one example, the susceptor is silicon carbide. In another example, the susceptor is silicon carbide coated silicon or silicon carbide coated graphite.

The susceptor 112 is disposed on a susceptor support 114 that has a plurality of arms 118 for supporting the susceptor 112. The susceptor 112 may rest on the arms 118, or may be attached to the arms 118. The arms 118 project from a shaft 116 that extends outside the enclosure 102 through an opening 126 in a wall of the enclosure 102. The opening is sealed by a seal 136 that reduces or prevents intrusion of environmental gases into the enclosure 102 during reduced pressure operation. The shaft 116 is rotatable, and thus can rotate the susceptor support 114 and the susceptor 112 about a point on a substrate receiving surface of the susceptor 112, by coupling to a rotational actuator 128. The support 114 can be moved linearly in its axis of rotation direction, that is, the support 114 can be raised and lowered, by coupling of the shaft to a linear actuator 130. The linear actuator 130 includes a contact member 132 that contacts the support 114 and a motor 134 that moves the contact member 132 linearly to move the support 114 linearly along its axis of rotation. In this way, the support 114 can be raised and lowered. The susceptor support 114 is typically made of a material such as quartz, silica, or sapphire that minimizes absorption of radiation intended to heat the susceptor.

A substrate is positioned on the susceptor 112 for processing thereof. The susceptor 112 is lowered to a substrate loading and unloading position such that the susceptor 112 is positioned below the level of an access port 138, shown in the rear of the processing chamber 100 in FIG. 1. The linear actuator 130 retracts the support 114, moving the susceptor toward the second portion 108. Lift pins 120 are coupled to the susceptor 112 in the embodiment of FIG. 1, hanging in openings formed in the susceptor 112. As the susceptor 112 moves toward the second portion 108, the lift pins 120 contact the second portion 108 and the upper ends thereof extend above the susceptor 112 to a substrate loading and unloading position. A substrate handler (not shown) reaches through the access port 138 to deposit a substrate on, or retrieve a substrate from, the lift pins 120. When a substrate is deposited on the lift pins 120, the support 114 can be moved by the linear actuator 130 to a processing position, lifting the substrate off the lift pins 120 in the process. It should be noted that, in some embodiments, the lift pins 120 may be separately actuated by a separate actuator.

During processing, energy is applied to the susceptor 112 by an energy module 122. The energy module 122 of FIG. 1 includes a plurality of energy emitters disposed in individual receptacles 124. In one embodiment, the receptacles 124 may be tubes formed in a housing and the energy emitters may be lamps or other radiant emitters (such as LED's, lasers, VCSEL's, and the like). The energy emitters irradiate the susceptor 112 with thermal radiation which heats the susceptor 112. The susceptor 112, in turn, conducts and/or radiates heat to the substrate disposed thereon. Process gases may be provided to the enclosure 102 through an inlet port 140 formed through a wall of the enclosure 102, and in this case also through a wall of the inner enclosure 104, for example formed through the third portion 110, for performing processes on the substrate within the processing volume 103. It should be noted that in cases where an inner enclosure 104 is used, two different inlet ports may be used to admit process gases to the inner enclosure 104. That is to say a first inlet port, such as the inlet port 140, may be formed through a wall of the enclosure 102, and a second inlet port (not shown in FIG. 1) not adjacent to, or co-located with, the first inlet port may be formed through a wall of the inner enclosure.

Process gas sources (not shown) are coupled to the inlet port 140 to flow process gases into proximity with the substrate. The substrate can be rotated during processing by activating the rotational actuator 128. Gases interact, and in some cases react, with the substrate. Exhaust gases flow out of the enclosure 102, and in some cases the inner enclosure 104, through an exhaust port 142 formed in a wall of the enclosure 102, and in this case through a wall of the inner enclosure 104. As described above with respect to the inlet port 140, two exhaust ports may be used in some cases. A vacuum source (not shown) is coupled to the exhaust port 142 to exhaust gases from the processing chamber 100 and maintain a vacuum inside the enclosure 102.

The second portion 108 generally has a shape that follows the shape of the surface of the energy module 122 adjacent to the second portion 108. The second portion 108 is made of a material that is substantially transparent to the energy emitted from the energy module 122 to the susceptor 112. In other cases, the second portion 108 may be made of a material that absorbs radiation from the energy module 122 and emits radiation therefrom toward the susceptor 112. The second portion 108 has a hollow neck 127 that extends downwardly to the opening 126 in the enclosure 102 to allow the shaft 116 to extend therethrough and then outwardly of the opening 126. The neck 127 of the second portion 108 and the shaft 116 extend through an opening in the energy module 122, which is located between the lower wall of the enclosure 102 and the second portion 108. As noted above, in some cases there is no inner enclosure 104. In those cases, there is no second portion 108 between the energy module 122 and the susceptor 112.

The processing chamber 100 includes a reflector 148 positioned facing the susceptor 112. During processing, the reflector 148 reflects radiation emitted by the substrate disposed on the susceptor 112 back toward the substrate.

A directed energy source 150 is disposed outside the enclosure 102 and is coupled to the enclosure 102. The directed energy source 150 can also be disposed inside the enclosure 102. For example, the directed energy source 150 may be attached to an inside surface of a wall of the enclosure 102, in this case between the enclosure 102 and the first portion 106. In some cases, the directed energy source 150 is only disposed inside the enclosure 102 if a temperature of the directed energy source 150 can be suitably maintained low enough to reduce an occurrence of damage to the directed energy source 150. For example, the directed energy source 150 may be cooled by circulating cooling fluids through the directed energy source 150. The directed energy source 150 produces directed thermal radiation. The directed energy source 150 is coupled to the enclosure in a way that enables the directed energy source 150 to emit the directed thermal radiation into the enclosure 102 and toward the susceptor 112.

The directed energy source 150 includes one or more emitters 156 that emit the directed thermal radiation. The emitters 156 are coupled to a power supply 152 which powers the emitters 156 to emit the directed thermal radiation. The emitters 156 may be lasers, LED's, and VCSEL's in any combination, along with optics for directing the thermal radiation emitted by the emitters 156 in a desired direction. In one case, the emitters 156 are laser diode arrays that are coupled to the enclosure 102 by optical fibers. In other cases, the emitters 156 may be solid state lasers mounted to the enclosure 102. The first portion 106 and second portion 108 are fabricated from a material that is substantially transparent to at least a portion of the directed thermal radiation. For example, the first portion 106 and the second portion 108 may be fabricated from quartz or sapphire.

The emitters 156 may emit pulsed or continuous radiation. In one embodiment, the emitters 156 emit a spectrum of radiation that is monochromatic to broadband, with wavelengths in the UV, visible, and infrared spectrum ranging from 200 nm to 2 μm. When lasers are used, the lasers may be pulsed by any combination of power cycling, electronic shuttering, and Q-switching.

Refractive and reflective optics may be employed to direct the thermal radiation emitted by the emitters 156 to a target location adjacent to the susceptor 112, where a substrate would be positioned during processing. Openings 158, which may alternatively be windows, may be provided in the reflector 148 to pass the directed thermal radiation through the reflector 148 to the susceptor 112. Alternatively, the reflector 148 may be made of a material substantially transparent to the directed thermal radiation. In such an example, openings may not be formed in the reflector 148. For example, the reflector may be fabricated from a material that allows most radiation at or below 1.1 μm to pass therethrough and reflects most radiation above about 1.5 μm.

As mentioned above, the emitters 156 are powered by the power supply 152, and an optional controller 154 may be coupled to the power supply 152 to control operation thereof. The shaft 116 includes one or more signal features 144 on the shaft 116 to control operation of the directed energy source 150. The signal features 144 are used to trigger operation of the directed energy source 150, for example, as described below.

A signaler 146 is positioned proximate to the signal features 144 to accept signaling from the signal features 144. The signaler 146 is coupled to the directed energy source 150 by directly coupling to the power supply 152, coupling to the controller 154, or coupling to control mechanisms, such as electronic shuttering of the emitters 156, at the output of the directed energy source 150. The signaler 146 receives a signal from a signal feature 144 and produces a signal to control emission of directed thermal radiation by the directed energy source 150. The signal is transmitted from the signaler 146 to the controller 154, the power supply 152, and/or the directed energy source 150. The signal features 144 and signaler 146 are used to synchronize operation of the directed energy source 150 with rotation of the support 114 so that the energy emitted by the directed energy source 150 can be targeted to specific locations as the support 114 rotates.

Figure 2A:
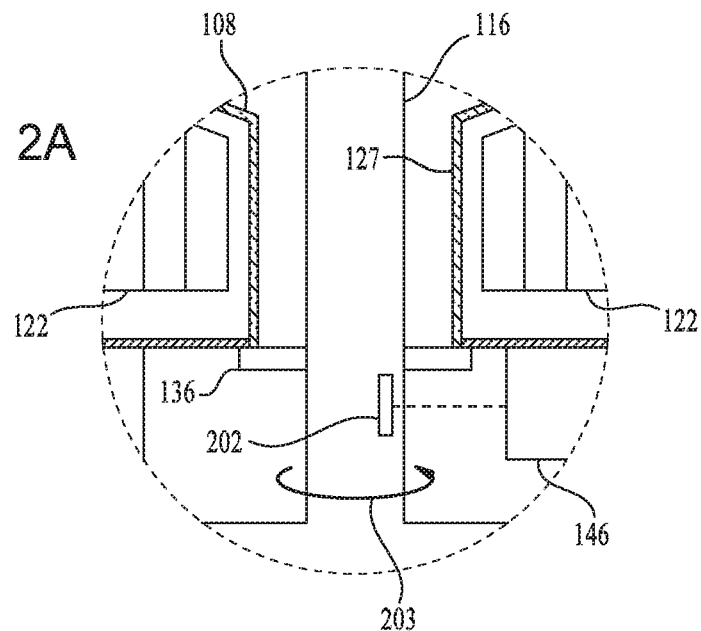
FIG. 2A is a detailed view of a portion of the processing chamber of FIG. 1.

FIG. 2A is a detailed view of a portion of the processing chamber 100. In the view of FIG. 2A, one implementation of a signal feature is shown. The shaft 116 has at least one signal feature 202 thereon. In one embodiment, the signal feature 202 is a reflective portion of the shaft 116. Rotation of the shaft 116 is indicated by arrow 203. The signaler 146 in FIG. 2A emits an optical signal toward the shaft 116. As the shaft 116 rotates, the signal feature 202, which may be a strip of reflective material affixed to the shaft 116, or merely a polished portion of the shaft 116 that is more reflective than the rest of the shaft 116, rotates into registration with the optical signal emitted by the signaler 146. Electromagnetic energy from the signaler 146 reflects from the signal feature 202 to a detector located in the signaler 146 when the shaft 116 reaches an angular position where such registration occurs.

Detection of the reflected electromagnetic energy can trigger firing of the directed energy source 150 to cause a pulse of directed thermal energy to be emitted toward the substrate disposed on the susceptor 112. A pulse of radiation output may be triggered from the directed energy source 150 based on a reflection property of the signal feature 202. A fixed direction of the radiation output of the directed energy source 150 causes the same location of the substrate to receive the directed thermal energy each time the directed thermal energy is emitted from the directed energy source 150. For example, by timing the emission of the pulse of directed thermal energy based on, for example, a fixed time after a certain change in reflection from the shaft 116 is detected, the position on the substrate receiving the pulse of directed thermal energy will be the same location for each pulse of directed thermal energy. Likewise, the directed energy source 150 can be configured so that a pulse of directed thermal energy is emitted with each complete rotation of the shaft 116, and is received at the same position on the substrate positioned on the susceptor 112.

Alternatively, the number of complete rotations of the shaft 116 can be set to be greater than one. However, as long as the triggering event to emit pulses of directed thermal energy is the same, the same location on the substrate will receive the repeated irradiations of directed thermal energy. Also, if a controller, such as the controller 154 is used, rather than, or in addition to, merely triggering a pulse from the directed energy source 150, more complex operations can be activated by detection of reflected electromagnetic energy, as described further below.

Figure 2B:
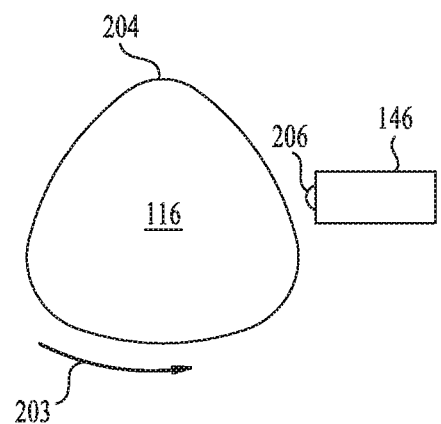
FIGS. 2B and 2C are schematic configuration views showing implementation of various signal features in the processing chamber of FIG. 1.
Figure 2C:
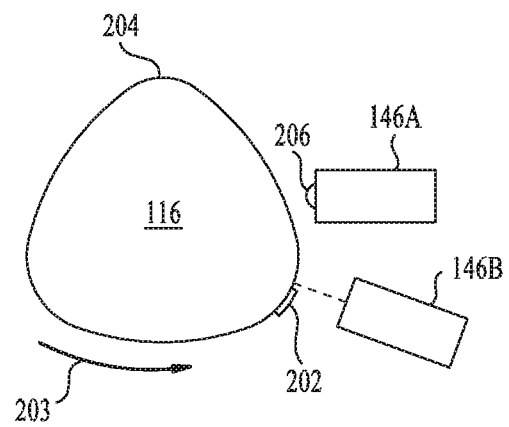

FIGS. 2B and 2C are schematic configuration views showing implementation of various signaling configurations useful to trigger the emission of the directed thermal energy pulse. The views of FIGS. 2B and 2C are looking down the shaft 116 from above. In FIG. 2B, the shaft 116 includes one or more protrusions 204 and the signaler 146 includes a depressible switch 206. As the shaft 116 rotates, indicated by arrow 203, a protrusion 204 physically depresses the switch 206 to operate the signaler 146. The shaft 116 may have any number of protrusions 204. As shown in FIG. 2B, three protrusions 204 are formed at equidistant angular locations (i.e., 120°) on the shaft to produce pulses from the directed energy source 150 at rotational intervals of 120° directed to three specific different locales on the substrate surface. Such an arrangement can be used, for example, to compensate for cool spots on the substrate surface resulting from the presence of the heads of the lift pins 120 (shown in FIG. 1) located in the susceptor 112 below the substrate at 120° intervals.

The protrusions 204 can be positioned on the shaft 116 and aligned with the lift pins 120 (for example at 120° angular positions in circular registration with the lift pin locations). In that case, as a lift pin 120 moves under the directed energy source 150, a protrusion 204 depresses the switch 206 and the directed energy source 150 emits a pulse of directed thermal energy toward the substrate to compensate for a cool spot on the substrate produced by the presence of the lift pin 120 therebelow. Note that in such cases, the lift pins 120 are typically located at a single radial distance from a center of the susceptor 112, so the directed energy source 150 can be located at the same radial distance from the center of the susceptor 112.

FIG. 2C shows a combination of a signal feature 202 and protrusions 204. In FIG. 2C, the signal feature 202 is disposed on one of the protrusions 204. A first signaler 146A has a depressible switch 206 for interacting with the protrusions 204, while a second signaler 146B has an optical signal emitter and an optical detector to detect the signal feature 202. In this way, different behaviors of the directed energy source 150 can be controlled independently.

Note that the angular location of one of the protrusions 204 and the signal feature 202 are essentially the same in FIG. 2C, but the angular location of the first and second signalers 146A and 146B, respectively, are different, so the behaviors triggered by the two signal features may occur at different rotational positions of the substrate, and thus will target different locations on the substrate. Also note that the depressible switch 206 and the optical emission and detection features can be combined in a single signaler 146. In that case, and that the angular positions of the signal features 202 and protrusions 204 on the shaft 116 can be different to enable specific targeting of the two behaviors, which may be the same, for example emitting of pulses of radiation, or different as further described below.

Figure 3A:
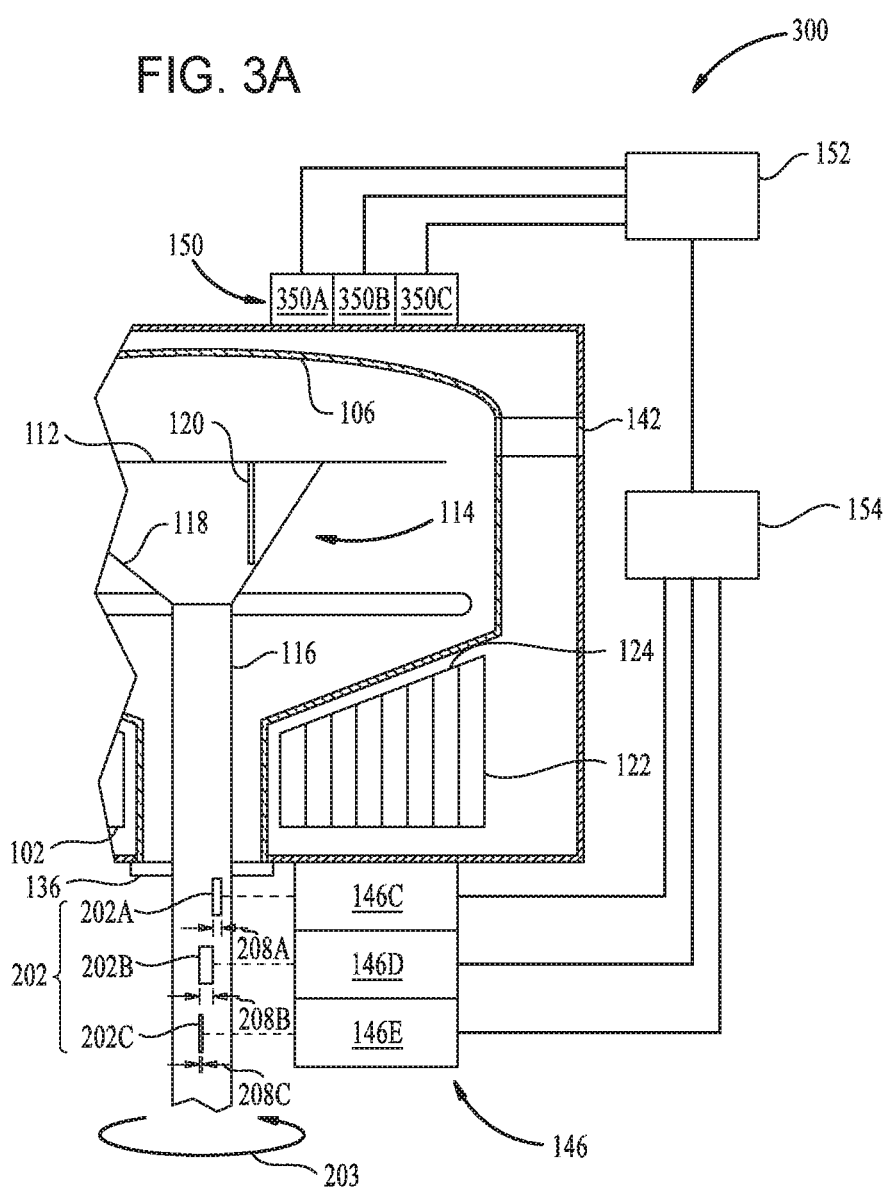
FIG. 3A is a partial cross-sectional view of a processing chamber according to another embodiment.

FIG. 3A is a partial cross-sectional view of a processing chamber 300 according to another embodiment. The processing chamber 300 is similar to the processing chamber 100 in FIG. 1 in many ways. Identical features between the processing chamber 100 and the processing chamber 300 are labelled with the same reference numerals. The processing chamber 300 is different in implementation of the signal features, signalers, and directed energy sources.

The processing chamber 300 includes a directed energy source 150 comprising three directed thermal energy emitters 350A, 350B, and 350C. In the processing chamber 300, the emitters 350A, 350B, 350C are located at different radial positions to direct thermal radiation to different locations on a substrate. A power supply 152 is coupled to and provides power to each emitter 350A, 350B, 350C.

The shaft 116 of the processing chamber 300 includes a number of signal features 202A, 202B, and 202C. Each of the signal features 202A, 202B, and 202C are located at different angular positions on the shaft 116 and at different elevations on the shaft 116. A first signal feature 202A is located at a first position on the shaft 116 and a second signal feature 202B is located at a second position on the shaft 116. The second position is different from the first position in angular position and in elevation. A third signal feature 202C is located at a third position on the shaft 116. The third position is different in angular position and elevation position from the first position and the second position.

In the processing chamber 300, the signaler 146 includes three signalers 146C, 146D, and 146E, one for each of the signal features 202A, 202B, and 202C. A first signaler 146C is positioned to engage with the first signal feature 202A; a second signaler 146D is positioned to engage with the second signal feature 202B; and a third signaler 146E is positioned to engage with the third signal feature 202C. In one embodiment, each of the signalers 146C, 146D, and 146E is an optical signaler with an optical emitter and an optical detector, and each of the signal features 202A, 202B, and 202C is a reflective portion on the shaft 116. The signalers 146C, 146D, and 146E each send a signal, when the signal features 202A, 202B, and 202C engage with the respective signalers 146C, 146D, and 146E, to the controller 154.

The controller 154 controls the power supply 152 based on the signals from the signaler 146 so that the directed thermal energy emitters 350A, 350B, and 350C are operated according to the signals from the signalers 146C, 146D, and 146E. In one embodiment, a signal from the first signaler 146C controls the first emitter 350A, a signal from the second signaler 146D controls the second emitter 350B, and a signal from the third signaler 146E controls the third emitter 350C. Each emitter 350A, 350B, and 350C emits a pulse of directed thermal energy toward the substrate upon receiving a signal originating from its respective signaler 146C, 146D, and 146E.

The different angular positions of the reflective signal features 202A, 202B and 202C cause signals to be emitted for controlling the emitters 350A, 350B, and 350C at different angular positions of the shaft 116, and therefore at different angular positions on the substrate positioned on the susceptor. In this way, the emitters 350A, 350B, and 350C direct thermal energy to different parts of the substrate upon each rotation of the shaft 116.

The signal features 202A, 202B, and 202C have different widths. The first signal feature 202A has a first width. The second signal feature 202B has a second width that is greater than the first width. The third signal feature 202C has a third width that is less than either the first width or the second width. In one embodiment, the power supply 152 is configured to power the emitters 350A, 350B, and 350C when their respective signal features 202A, 202B, and 202C reflect the optical signal emitted by the respective signalers 146C, 146D, and 146E.

The signalers 146C, 146D, and 146E are located at elevations matching the elevation location of their respective signal features 202A, 202B and 202C such that the optical signals emitted by the signalers 146C, 146D, and 146E can engage the respective signal features 202A, 202B, and 202C. The reflected optical signals are received by optical detectors in the respective signalers 146C, 146D, and 146E, and a signal is emitted by the signaler 146 to the controller 154 while an optical signal is detected by one of the signalers 146C, 146D, and 146E. The respective emitter 350A, 350B, and 350C emits radiation while the power supply 152 supplies power to that emitter 350A, 350B, and 350C.

The power supply 152 supplies power to the emitters 350A, 350B, and 350C while a signal is received by the power supply 152 from the controller 154. The controller 154 emits a signal to power one of the emitters 350A, 350B, and 350C during the period of time that a signal is received from a respective signaler 146C, 146D, and 146E. In this way, the width of the signal features 202A, 202B, and 202C, at a given fixed rotation rate of the shaft, controls the duration of pulses emitted by the emitters 350A, 350B, and 350C. The pulses of directed thermal energy, as described above, supplement the radiant energy emitted by the energy module 122 to improve temperature uniformity of the substrate during processing.

Figure 3B:
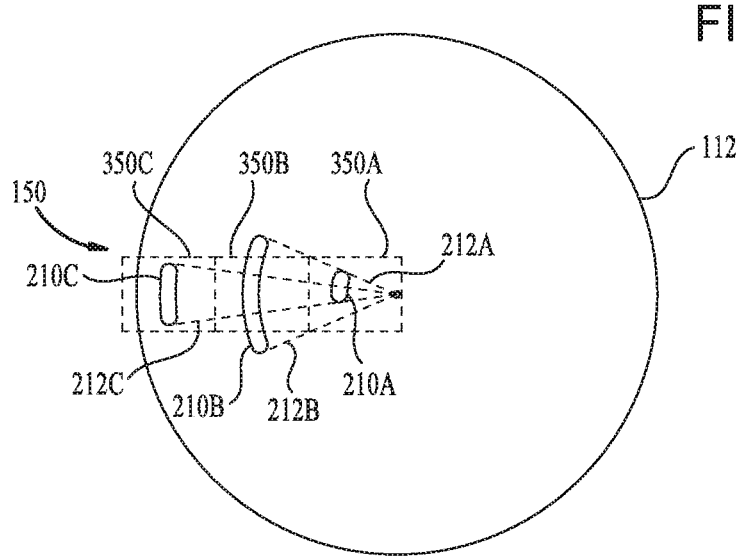
FIG. 3B is a schematic top view of the processing chamber of FIG. 3A.

FIG. 3B is a schematic top view of the susceptor 112 of the processing chamber 300, with the directed energy source 150 shown in phantom. The directed energy emitters 350A, 350B, and 350C are arranged along a radius of the susceptor 112. Three treatment zones 210A, 210B, and 210C are shown, which subtend respective angles 212A, 212B, and 212C.

The angles 212A, 212B, and 212C, and thus arcuate lengths of the treatment zones 210A, 210B, and 210C, are determined by arcuate lengths 208 of the signal features 202 on the shaft 116. Each of the arcuate lengths 208A, 208B, and 208C extends over an angle with respect to the central axis of the shaft 116, and the angular extent of each arcuate length 208 matches a respective angle 212A, 212B, and 212C. The angle defined by the arcuate length 208A matches the angle 212A, the angle defined by the arcuate length 208B matches the angle 212B, and the angle defined by the arcuate length 208C matches the angle 212C.

Each time the susceptor 112 rotates, the signal feature 202A circulates into registration with the signaler 146C, which sends a signal to start when a first edge of the signal feature 202A circulates into registration with the signaler 146C. The signal from the first signaler 146C activates the first emitter 350A at the time the corresponding leading edge of the first treatment zone 210A moves under the first emitter 350A. As the signal feature 202A circulates past the signaler 146C, the signal feature 202A reflects light emitted toward the signal feature 202A by the signaler 146C back toward the signaler 146C.

During the time period when the signaler 146C detects reflected light from the first signal feature 202A, the signaler 146C transmits a signal to the controller 154, which in turn controls the power supply 152 to power the first emitter 350A, which emits a pulse of directed thermal energy to the treatment zone 210A as the susceptor 112 is rotated about the shaft axis.

In this way, the pulse of directed thermal radiation emitted by the emitter 350A extends along an arc that irradiates the same treatment zone 210A on the substrate each time the susceptor 112 rotates about the shaft axis by one revolution. The same is true of the signal features 202B and 202C and the respective corresponding treatment zones 210B and 210C. The size of the irradiated arc for each treatment zone 210A, 210B, and 210C is controlled by the arcuate lengths 208 of the signal features 202A, 202B, and 202C and the angular positions of the treatment zones 210A, 210B, and 210C are controlled by the opposed ends or sides of the signal features 202A, 202B, and 202C on the shaft 116 in the direction of rotation 203.

Figure 3C:
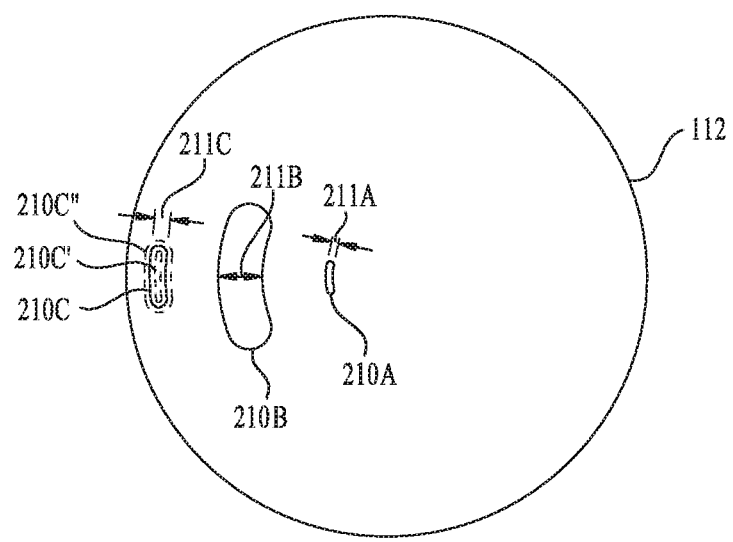
FIG. 3C is a schematic top view of a processing chamber according to another embodiment.

FIG. 3C is a schematic top of a processing chamber according to another embodiment. The processing chamber schematically depicted in FIG. 3C is similar to the processing chambers 100 and 300, except that one or more of the directed thermal radiation emitters has a sizing element that determines radial coverage of the electromagnetic radiation emitted by the emitter. Thus, the treatment zones 210A, 210B, and 210C in FIG. 3C may have different radial widths. In FIG. 3C, the treatment zone 210A has a first radial width 211A, the treatment zone 210B has a second radial width 211B, and the treatment zone 210C has a third radial width 211C. The radial widths 211A, 211B, and 211C are all different.

Figure 3D:
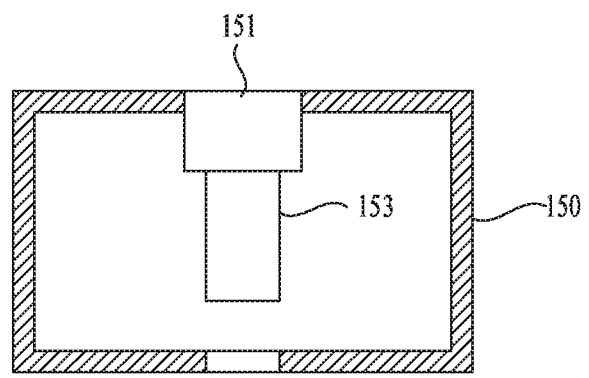
FIG. 3D is a schematic side view of a radiation source according to one embodiment.

FIG. 3D is a schematic side view of a directed thermal radiation emitter 150 according to one embodiment. In this case, the directed thermal radiation emitter 150 has a source 151 of directed thermal radiation and a sizing component 153 that adjusts a size of the radiation field emitted by the source 151. The sizing component 153 may be a lens, aperture, or more exotic optical element including reflective and/or refractive components, that adjusts a radial extent of the directed thermal radiation emitted by the emitter 150, and incident at the susceptor 112. The sizing component 153 may be adjustable and/or swappable to allow re-sizing of the electromagnetic radiation field at will.

Referring again to FIG. 3C, the treatment zone 210C illustrates the effect of a swappable or adjustable sizing component 153. By adjusting or swapping the sizing component 153, the width of the treatment zone 210C can be widened to 210C" or narrowed to 210C', each treatment zone having corresponding radial widths. In this way, the radial extent of the directed thermal radiation can be controlled by applying the appropriate sizing component 153. The azimuthal extent and other features of the electromagnetic radiation can be controlled using the signal features of the shaft 116, as described elsewhere herein.

Figure 4A:
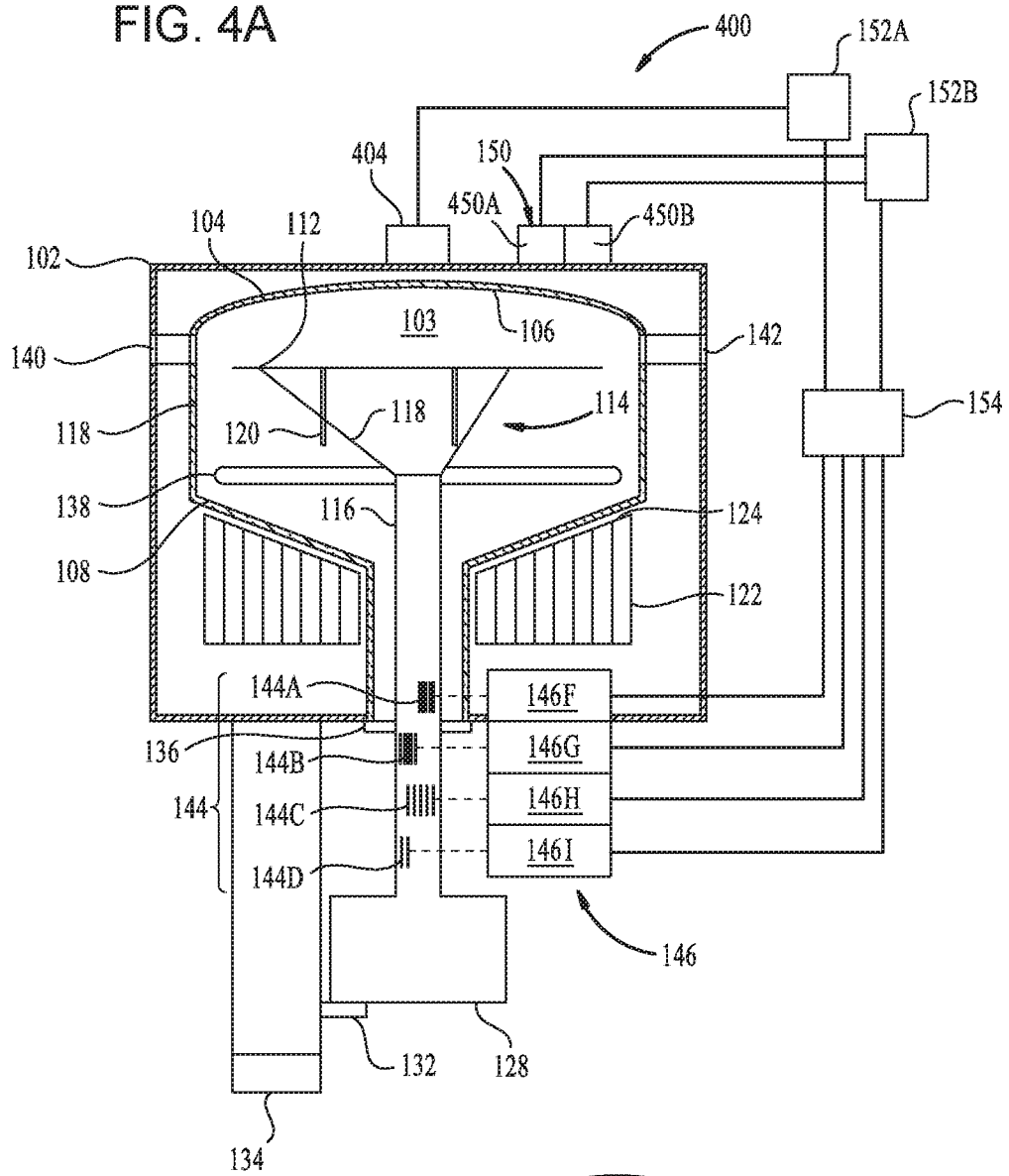
FIG. 4A is a partial cross-sectional view of a processing chamber according to another embodiment.

FIG. 4A is a schematic side view of a processing chamber 400 according to another embodiment. The processing chamber 400 is similar to the processing chambers 100 and 300, with similar elements labeled using the same reference numerals. The chamber 400 is different from the chamber 100 in the use of signal features, signalers, and directed energy sources. The chamber 400 has a first directed energy source 150 and a second directed energy source 404. The first directed energy source 150 is located at a first location, coupled to the enclosure 102, and the second directed energy source 404 is located at a second location, coupled to the enclosure 102. Both directed energy sources 150 and 404 are shown coupled to the enclosure 102 outside of the processing volume 103, but either or both of the directed energy sources 150 and 404 may be coupled to the enclosure 102 on an internal surface thereof.

Figure 4B:
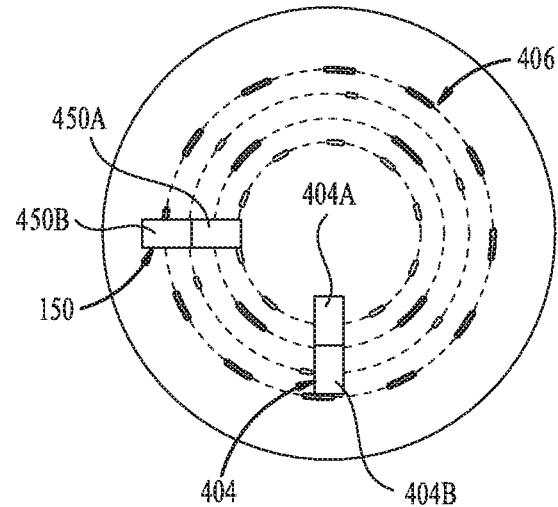
FIG. 4B is a schematic top view of the processing chamber of FIG. 4A.

The first directed energy source 150 includes a first emitter 450A and a second emitter 450B arranged along a ray extending radially from an axis of rotation of the shaft 116, as is further described below. The second directed energy source 404 also includes two emitters, not visible in the side view of FIG. 4A. FIG. 4B is a partial top view of the chamber 400 of FIG. 4A. The configuration of the first and second directed energy sources 150 and 404 are shown in FIG. 4B.

In FIG. 4B, the emitters 450A, 450B of the first directed energy source 150 are oriented along a first ray extending radially from the axis of rotation of the shaft 116, and the third emitter 404A and a fourth emitter 404B of the second directed energy source 404 are oriented along a second ray extending radially from the axis of rotation of the shaft 116. The directed energy sources 150 and 404 may be oriented in any convenient way to illuminate desired treatment areas on the surface of the substrate disposed on the susceptor 112 with directed thermal radiation. As shown in FIG. 4B, the second directed energy source 404 includes the third emitter 404A and the fourth emitter 404B.

Referring back to FIG. 4A, a plurality of signal features 144 is incorporated in the shaft 116 of the chamber 400. A first group 144A of signal features is disposed on the shaft 116 at a first elevation. A second group 144B of signal features is disposed on the shaft 116 at a second elevation. A third group 144C of signal features is disposed on the shaft 116 at a third elevation. A fourth group 144D of signal features is disposed on the shaft 116 at a fourth elevation.

In the processing chamber 400, each of the groups of signal features 144A, 144B, 144C, 144D are configured to cause a signal for control of one of the emitters 450A, 450B, 404A, 404B to occur. For example, the controller 154 may be configured to use the first group 144A of signal features to control the operation of the first emitter 450A, the second group 144B of signal features to control the operation of the second emitter 450B, the third group 144C of signal features to control the operation of the third emitter 404A, and the fourth group 144D of signal features to control the operation of the fourth emitter 404B. In this way, the signal features 144 of the chamber 400 are used to enable the controller 154 to independently control the operation of the emitters 450A, 450B, 404A, and 404B. As noted above, the controller 154 may be eliminated, and the signalers 146F, 146G, 146H, and 146I directly connected to power supplies 152A and 152B to provide direct switching of the directed energy sources 150 and 404 into on and off states using only the signalers 146F, 146G, 146H, and 146I and the signal features 144.

It should be noted that various types of control may be applied to emitters such as the emitters 450A, 450B, 404A, 404B of the respective directed energy sources 150 and 404. For example, the first group 144A of signal features may provide a signal used to switch one or more of the emitters 450A, 450B, 404A, 404B between the on or off states. For example, a signal from the first signal feature of the first group of signal features 144A is used to cause the emitter 404A to power on at a first angle and a neighboring second signal feature of the first group of signal features 144A, separated from the first signal feature of the first group of signal features 144A by an angle, is used to cause the emitter 404A to power off. Thus, one or more beams of directed thermal energy may irradiate a portion of the substrateas the susceptor 112 rotates during operation, even when no signal feature of the first group of signal features 144 is in registration with the signaler 146F.

As an example, the first signal feature of the first group of signal features 144A signals the signaler 146, which sends a signal to power the emitter on. The emitter emits a beam of directed thermal energy to heat a location of the substrate. The beam remains active as the first signal feature of the first group of signal features 144A circulates out of registration with the signaler 146. The beam continues to irradiate the substrate as the substrate rotates with the susceptor until the second signal feature of the first group of signal features 144A circulates into registration with the signaler 146. When the second signal feature of the first group of signal features 144A circulates into registration with the signaler 146, the signaler 146 sends a signal to power the emitter off, switching the beam off. In this way, the signal features can be used to switch one or more of the emitters 450A, 450B, 404A, 404B on or off.

In another aspect, one or more signal features of the groups of signal features 144A, 144B, 144C, 144D may be used to cause a change in output power of one or more of the emitters 450A, 450B, 404A, 404B. For example, a first signal feature of the second group of signal features 144B may be used to trigger operation of one or more emitters 450A, 450B, 404A, and 404B at a first power level and a second signal feature of the second group of signal features 1446 may be used to trigger a change to a second power level. When the first signal feature of the second group of signal features 1446 circulates into registration with the signaler 146, the signaler 146 sends a signal to set output of the power supply 152A or 152B to one or more of the emitters 450A, 450B, 404A, 404B to the first power level, resulting in a beam having a first intensity irradiating a location of the substrate. The first power level remains as the first signal feature of the second group of signal features 1446 circulates out of registration with the signaler 146. When the second group of signal features 1446 circulates into registration with the signaler 146, the signaler 146 sends a signal to set output of the power supply 152A or 1526 to one or more of the emitters 450A, 450B, 404A, 404B to the second power level, resulting in a change in intensity of the beam to a second intensity. In this way, the signal features 144 can be used to control intensity of the beams emitted by one or more of the emitters 450A, 450B, 404A, and 404B.

In another aspect, the emitters 450A, 450B, 404A, 404B may emit more than one wavelength of directed thermal radiation, and the signal features 144 may trigger emission of one wavelength or another wavelength by operation of the controller 154, or by direct connection to the power supplies 152A and 152B. In such an embodiment, the emitters 450A, 450B, 404A, and 404B emit at more than one wavelength. For example, the emitter 450A emits thermal radiation at a different wavelength from the emitter 404A, and the emitter 450B emits thermal radiation at a different wavelength from the emitter 404B. When a first signal feature of the first group of signal features 144A circulates into registration with the signaler 146, the signaler 146 sends a signal to activate, for example, the emitter 450A (either firing a pulse or toggling), which emits a beam having a first wavelength toward the substrate. When a second signal feature of the first group of signal features 144A circulates into registration with the signaler 146, the signaler 146 sends a signal to activate, for example, the emitter 404A (either firing a pulse or toggling), which emits a beam having a second wavelength toward the substrate. In this way, radiation of different wavelengths can be triggered by use of signal features 144 and signalers 146, in cooperation with the power supplies 152A and 152B, and optionally the controller 154.

In the ways described above, the signal features 144 may be used to activate a complex pattern of operation of the directed energy sources 150 and 404 comprising multiple pulses, on/off cycles, power levels, and wavelengths of radiation, depending on the exact configuration. FIG. 4B illustrates how the configuration of the signal features 144, the signaler 146, the controller 154, the power supplies 152, and the directed energy sources 150 and 404 result in azimuthally patterned processing of treatment zones 406 at locations on the substrate determined by the positioning of the directed energy sources 150 and 404 and by the angular locations of the signal features 144 and the configuration of the signaler 146, the controller 154, and the power supplies 152A and 152B. The positions of the directed energy sources 150 and 404 aim the emitters therein toward the substrate. Rotation of the substrate brings an annular zone of the substrate within range of each emitter. Operation of the emitter, pulsing, toggling, adjusting power, etc., causes beams of directed thermal energy to irradiate portions of the annular zone accessible to the emitter, each irradiation area forms an arcuate irradiation zone (i.e., a treatment zone 406). The various treatment zones 406 patterned by one emitter lie along the annular zone accessible to the emitter. The angular position and arcuate length of each treatment zone 406 corresponds signaling between the signal features 144 and the directed energy sources 150 and 404.

Figure 5:
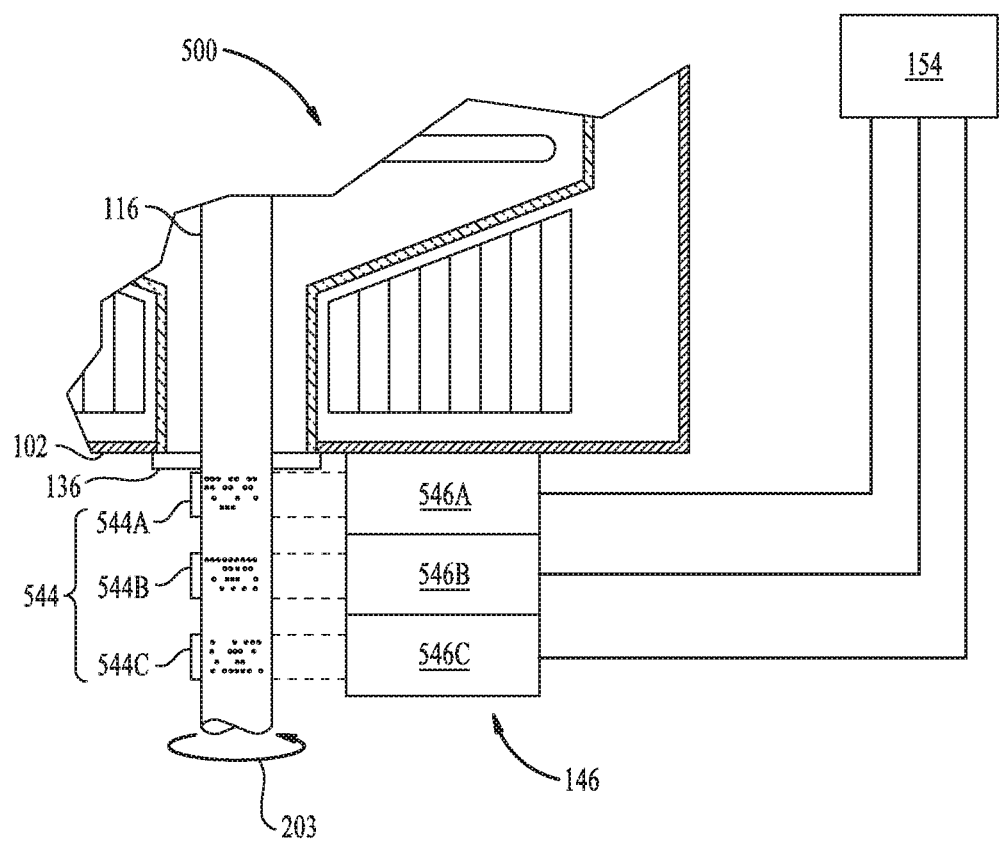
FIG. 5 is a partial cross-sectional view of a processing chamber according to another embodiment.

FIG. 5 is a partial cross-sectional view of a processing chamber 500 according to another embodiment. The chamber 500 is similar to the chambers 100 and 300, except in implementation of signal features and configuration of the signaler and controller. The chamber 500 has a plurality of signal features 544 coupled to the exterior of the shaft 116 of the chamber 500. The plurality of signal features 544 are arranged in a first group 544A, a second group 544B, and a third group 544C. Any number of groups, limited only by available space on the shaft 116 and the size of the signalers 146, may be used. The signal features 544 may be located on the shaft 116 at a location inside or outside of the enclosure 102, again limited only by available space.

The signal features 544 are a plurality of dots, which may be reflective or protruding, to drive the signalers 146. In one embodiment, the signaler 146 includes three optical-type signalers 546A, 546B, and 546C, but may include any number of optical-type and/or switch-type signalers. The signal features 544 may be aligned, or misaligned, axially along the shaft 116, according to the desired behavior of the directed energy source(s). The signal features 544 may be provided in any number of rows to engage with optical detectors in the signalers 146.

The signal features 544 provide a coded pattern to correspond to a complex pattern of behavior of one or more emitters of a directed energy source (not visible in FIG. 5). As noted above, the signal features 544 may be configured to cause a sequence of operations of one or more directed energy sources including pulsing, switching on and off, adjusting the power level, and selecting the wavelength of the radiation emitted by one or more of the emitters. The directed energy sources may be arranged to provide directed thermal energy to any preselected radius on the substrate, and the signal features 544 activate a pattern of the directed thermal radiation.

Figure 6:
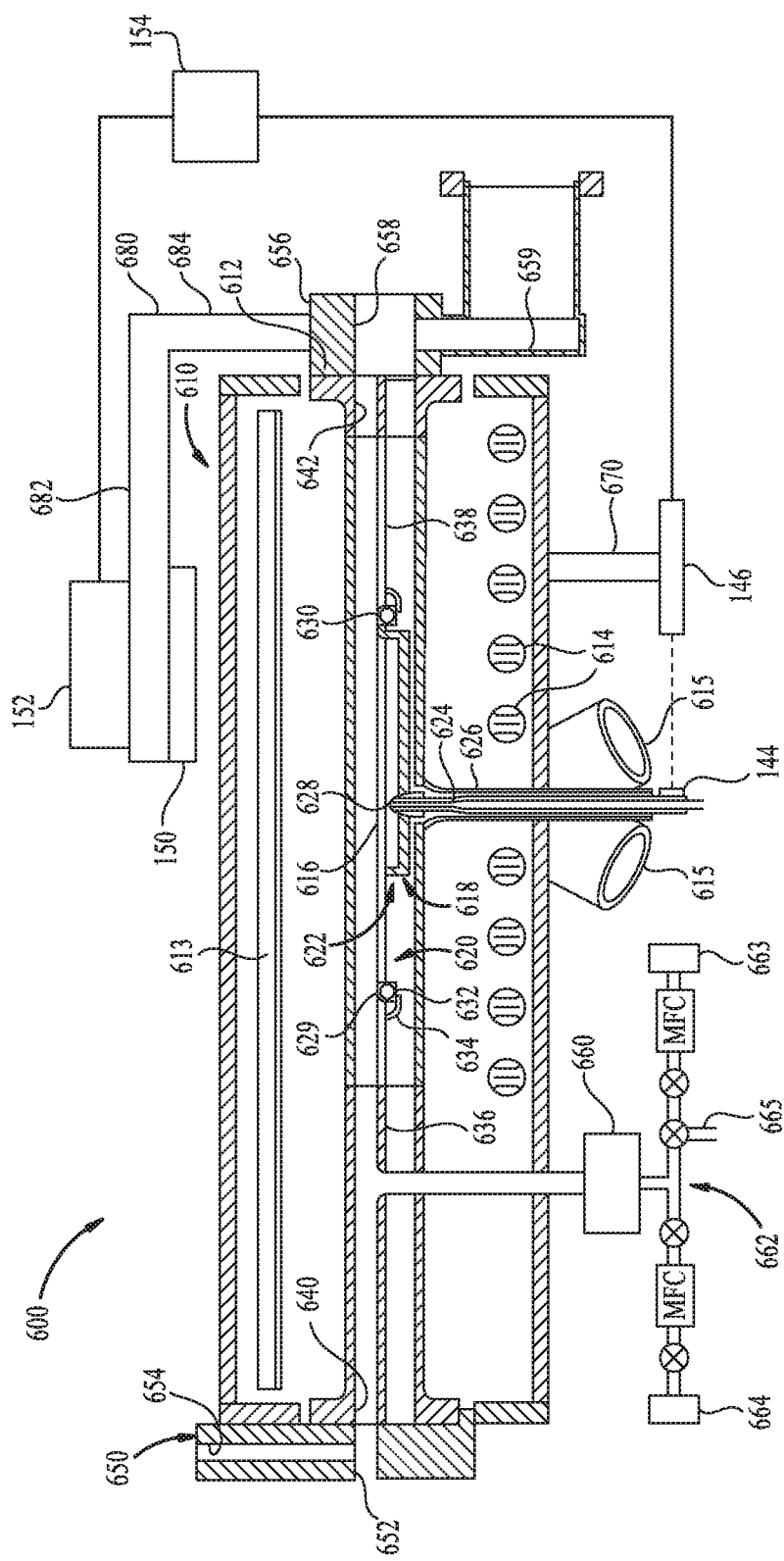
FIG. 6 is a schematic cross-sectional view of a processing chamber according to yet another embodiment.

FIG. 6 is a schematic cross-sectional view of a processing chamber 600 according to another embodiment. The processing chamber 600 features a single substrate chemical vapor deposition (CVD) reactor 610, including a quartz process or reaction chamber 612. A plurality of radiant heat sources is supported outside the chamber 612 to provide heat energy into the chamber 612 without appreciable absorption thereof by the walls of the chamber 612. The radiant heat sources include an upper heating assembly of elongated tube-type radiant heating elements 613. The upper heating elements 613 are preferably disposed in spaced-apart parallel relationship and also substantially parallel with the reactant gas flow path through and across the underlying reaction chamber 612. A lower heating assembly comprises similar elongated tube-type radiant heating elements 614 located below the reaction chamber 612 and oriented transversely to the upper heating elements 613. A portion of the radiant heat emitted by the heating elements 613, 614 is diffusely reflected into the chamber 612 by rough specular reflector plates (not shown) above and below the upper and lower heating elements 613, 614, each of which may be lamps or another radiant source, respectively. Additionally, a plurality of heating elements 615, such as spot lamps, supply concentrated heat to the underside of the substrate support structure (described below), to counteract a heat sink effect created by cold support structures extending through the bottom of the reaction chamber 612. Each of the elongated tube type heating elements 613, 614 may be a high intensity tungsten filament lamp producing radiant heat energy transmitted through the walls of the reaction chamber 612 without appreciable absorption thereby.

A substrate 616, which may be a silicon substrate or other semiconductor material, is shown supported within the reaction chamber 612 upon a substrate support structure 618. The illustrated support structure 618 includes a substrate holder 620, upon which the substrate 616 rests, and a support 622. The support 622 is coupled to a shaft 624, which extends away from the substrate holder 620 through a tube 626 extending from a lower wall of the chamber 612. The tube 626 may communicate with a source of purge or sweep gas which can flow during processing, inhibiting process gases from escaping to the lower section of the chamber 612. Sweep gas may also flow horizontally beneath the substrate holder 620 to aid in minimizing contaminant leakage from below.

A plurality of temperature sensors, for example one or more pyrometers or thermocouples, is positioned in proximity to the substrate 616. In the illustrated embodiment, the temperature sensors include a first or central thermocouple 628, disposed below the substrate holder 620 in any suitable fashion. The central thermocouple 628 passes through the support 622 in proximity to the substrate holder 620. The reactor 610 further includes a plurality of secondary or peripheral thermocouples, also in proximity to the substrate 616, including a leading edge or front thermocouple 629, a trailing edge or rear thermocouple 630, and a side thermocouple (not shown). Each of the peripheral thermocouples is housed within a slip ring 632, which surrounds the substrate holder 620 and the substrate 616. Each of the central and peripheral thermocouples may be coupled to the controller 154, which may be programmed to set the power of the various heating elements 613, 614, 615 in response to the readings of the thermocouples.

In addition to housing the peripheral thermocouples, the slip ring 632 absorbs and emits radiant heat during high temperature processing, such that the slip ring compensates for a tendency toward greater heat loss or absorption at substrate edges, a phenomenon which is known to occur due to a greater ratio of surface area to volume at the edge of a substrate. By minimizing edge losses, the slip ring 632 can reduce the risk of radial temperature non-uniformities across the substrate 616. The slip ring 632 can be suspended by any suitable means. For example, as shown, the slip ring 632 rests upon one or more elbows 634, which depend from a front chamber divider 636 and a rear chamber divider 638. The dividers 636, 638 may be quartz. In some arrangements, the rear divider 638 can be omitted.

The illustrated reaction chamber 612 includes an inlet port 640 for the injection of reactant and carrier gases, and the substrate 616 can also pass through the inlet port 640. An outlet port 642 is on the opposite side of the chamber 612, with the substrate support structure 618 positioned between the inlet port 640 and outlet port 642.

An inlet component 650 is coupled to the reaction chamber 612 surrounding the inlet port 640, and includes a horizontally elongated slot 652 through which the substrate 616 can be inserted. An inlet 654 receives gases from gas sources (not shown) and communicates such gases with the slot 652 and the inlet port 640. An outlet component 656 is similarly coupled to the reaction chamber 612 such that an exhaust opening 658 aligns with the outlet port 642 and leads to exhaust conduits 659. The exhaust conduits 659, in turn, can communicate with suitable vacuum means (not shown) for drawing process gases through the reaction chamber 612.

The illustrated reactor 610 also includes an optional source 660 of excited species including a remote plasma generator, a magnetron power generator and an applicator along a gas line 662. In the illustrated embodiment, microwave energy from a magnetron is coupled to a flowing gas in an applicator along a gas line 662. A precursor gas source 663 is coupled to the gas line 662 for introduction into the excited species generator 660. A carrier gas source 664 is also coupled to the gas line 662. One or more branch lines 665 can also be provided for additional reactants. Each gas line can be provided with a separate mass flow controller (MFC) and valves, as shown, to allow selection of relative amounts of carrier and reactant species introduced to the excited species generator 660 and thence into the reaction chamber 612. The excited species generator 660 can be employed for plasma enhanced deposition, but in the illustrated embodiments is employed for exciting etchants for cleaning the reaction chamber 612 of excess deposition when no workpiece is housed in the reaction chamber 612.

The chamber of FIG. 6 includes a directed energy source 150 supported from an attachable location, such as the outlet component 656, by an energy source support 680. The energy source support 680 is shaped to position the directed energy source 150 at a desired location to provide directed energy toward a selected treatment area of a substrate 616 on the substrate holder 620. In this case, the energy source support 680 includes an extension member 682 that extends over the substrate holder 620. The extension member 682 may extend horizontally over the substrate holder 620, for example parallel to a plane defined by the heating elements 613, or may be angled toward or away from the substrate holder 620. Additionally, although not shown in FIG. 6, the extension member 682 may extend in a direction parallel to the gas flow path through the reaction chamber 612, for example parallel to each of the heating elements 613, or in another example perpendicular to the inlet port 640 and the outlet port 642, or the extension member 682 may extend in a direction that forms an angle with an axis of one or more of the heating elements 613, the inlet port 640 and/or the outlet port 642.

The extension member 682 has a length determined by the target location on a substrate to be illuminated by directed thermal energy from the directed energy source 150. The length of the extension member 682 may be the distance from the outlet port 642 to either of the edge thermocouples 629, 630, or any distance between to illuminate the substrate 616. The extension member 682 is coupled to, attached to, or integral with, an elevation member 684 of the energy source support 680, which extends from the attachable location, in this case the outlet component 656, to a joint with the extension member 682, allowing the extension member 682 to swing clear the reactor 610 during maintenance or the reactor or the energy source(s) 150 and power source 152.

The power source 152 is also coupled to the extension member 682 of the energy source support 680 in FIG. 6, but may be coupled to the elevation member 684, or to another convenient location of the reactor 610. The power source 152 is coupled to the controller 154 (which may be eliminated, as described above), which is in turn coupled to the signaler 146, substantially as described above. The shaft 624 includes signal features 144, which may be any of the signal features described above. In FIG. 6, the signaler 146 is shown as an optical-type signaler coupled to the chamber 612 via a support 670. In some embodiments, the signaler 146 may be a physical switch-type signaler positioned in close proximity to the shaft 624 with the signal features 144. The signal features 144 may have any of the configurations described above to controlling any of the various controllable attributes described above.

The various patterns of operation described herein may be enabled by use of one or more signal features on the shaft of the substrate support in a processing chamber configured as a result of analyzing systematic non-uniformities resulting from operation of the chamber. FIG. 7 is a flow diagram summarizing a method 700 according to one embodiment. The method begins at operation 702 where one or more test substrates are processed in a thermal processing chamber according to identical test programs. At operation 704, the substrates are analyzed for processing non-uniformity. For example, deposition thickness can be measured across each substrate. Systematic variation in deposition thickness indicates systematic non-uniformities, which may be caused by thermal non-uniformities or material non-uniformities (such as gas flow) in the chamber.

At operation 706, the chamber, having directed energy sources coupled thereto, is programmed to provide directed thermal energy to locations in the chamber corresponding to the locations of systematic reduced deposition thickness using signal features coupled to a shaft in the chamber. The chamber can be programmed to turn on a directed energy source at a leading edge of a deposition zone where the resulting deposited layer is thinner in the deposition zone than the deposited layer surrounding the deposition zone, and to turn off the directed energy source at a trailing edge of the deposition zone. This behavior can be programmed for multiple deposition zones where the resulting deposited layer is thinner in the deposition zone than the deposited layer surrounding the deposition zone, by locating emitters at locations to access the deposition zones. If the deposition zone is small, the directed energy source may be pulsed with a pulse duration defined by an arcuate length of the deposition zone (in radians) divided by a rotation speed of the substrate support (radians per second). If the deposition zone is large, the directed energy source may be switched between the on and off states with a longer on period than a single pulse. If the deposited layer in the deposition zone has multiple different thicknesses, for example a first portion of the deposited layer has a first thickness and a second portion of the deposited layer has a second thickness different from the first thickness, the directed energy source may be pulsed and/or switched on and off or the power level applied to the directed energy source may be adjusted. Finally, if there are multiple deposition zones at different locations and a substrate to be processed has different compositions due to different structures and devices formed thereon, the chamber can be programmed to deliver different types of radiation at the deposition zones to optimize operation of the chamber.

Figure 8A:
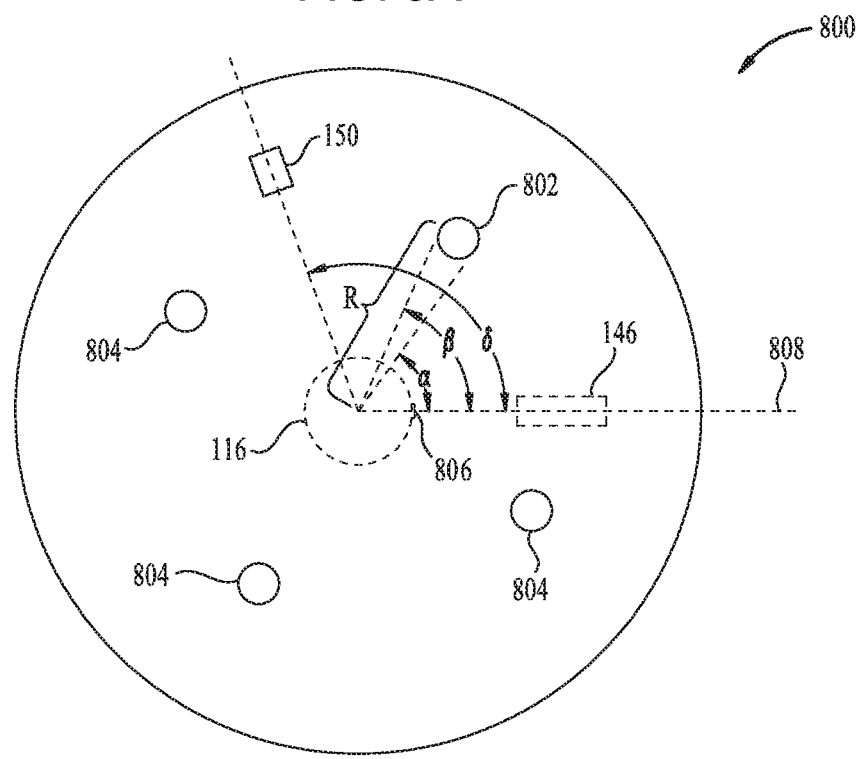
FIGS. 8A-8B are top views of a susceptor in operation according to another embodiment.

FIG. 8A is a top view of a susceptor 800 from a chamber with an asymmetric thermal non-uniformity 802 and three symmetric thermal non-uniformities 804. The symmetric thermal non-uniformities 804 may be due to lift pin cold spots and the asymmetric thermal non-uniformity 802 may be due to a local structural or compositional characteristic of the susceptor at the location of the asymmetric thermal non-uniformity. In this case, a single signal feature 806 can be applied to the susceptor support shaft 116 (shown in phantom below the susceptor 800), as described herein, to identify a home position 808 of the susceptor. In this way, the signal feature is a homing feature. The homing feature does not trigger firing the directed energy sources, but is used by the controller to track position of the susceptor as the susceptor rotates.

According to the method 700, the non-uniformities 802 and 804 can be identified according to circular coordinates, radius and angle, and the controller can be programmed to operate the directed energy sources to illuminate the areas of the substrate corresponding to the locations of the non-uniformities by activating beams of directed thermal energy when the susceptor reaches an angular position where the known location of a thermal non-uniformity coincides with the known position of an emitter of directed thermal energy. For example, in FIG. 8, the non-uniformity 802 is located at a radius R, where a directed energy source 150 can be positioned such that the emitter is at the radius R. The non-uniformity 802 extends across an azimuth that starts at an angle α from the homing feature 144 and ends at an angle β from the homing feature 144. A directed energy source 150 is shown, with an emitter located at an angular displacement ∂ from an optical axis of the signaler 146 at which the homing feature 144 registers with the signaler 146. These coordinates can be programmed in the controller 154 as constant locations of the non-uniformity 802 relative to the homing position.

Figure 8B:
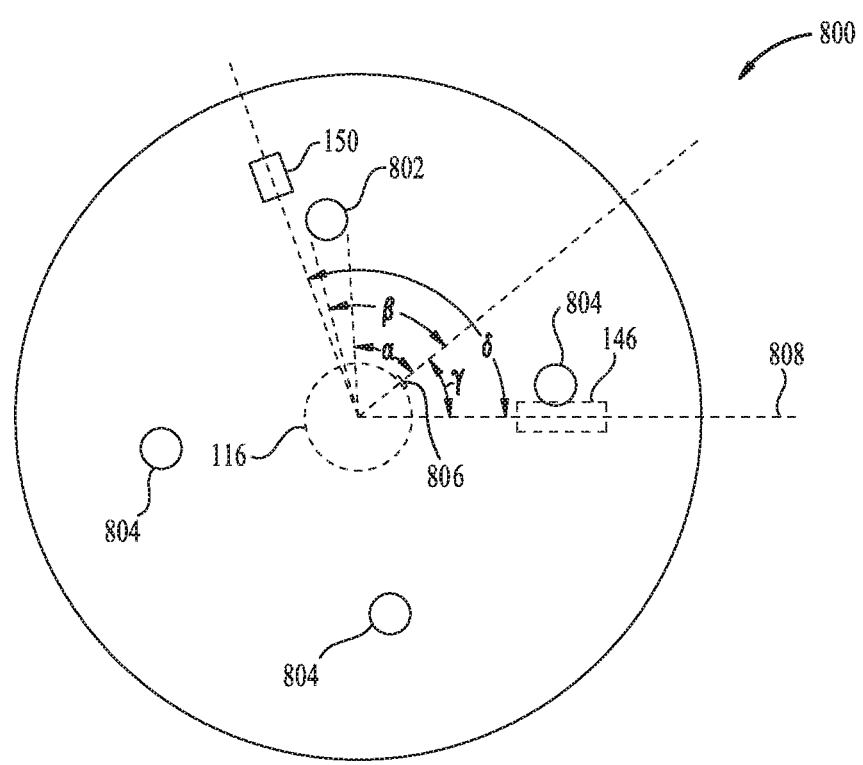

FIG. 8B is a top view of the susceptor 800 after rotation by an angle γ. The signaler 146 detects the signal feature 806 when the susceptor 800 is at the home position 808, in the various ways described herein. The signaler 146 signals the controller, which registers that the susceptor 800 is at the home position 808, so γ=0. The controller can track angular displacement of the susceptor 800, and identify the angle γ as the susceptor 800 rotates, by computing angular displacement from the home position 808 according to rotation speed and time (rotation speed×time=angular displacement). Instantaneous rotation speeds and times can be multiplied and summed following detection of the homing feature 144 to yield the angular displacement γ. The angular location of the non-uniformity 802 can then be computed as front edge at β+γ and back edge at α+λ. The computed angular displacement of the thermal non-uniformity (front edge and back edge) can be compared to the known angular position ∂ of the emitter, and when the controller determines that β+γ=∂, the controller can activate the directed energy source 150 to emit directed thermal energy to the location on the substrate corresponding to the thermal non-uniformity. When the controller determines that α+γ=∂, the controller can deactivate the directed energy source 150. Note that if the beam width is taken into account, beam position may be defined by two angles ∂₁ and ∂₂ specifying the edges of the beam, and beam operation may be predicated on the two angles ∂₁ and ∂₂ in any desired way.

Similar methods can be used to treat the symmetric non-uniformities 804 using one directed energy source and three known positions of symmetric thermal non-uniformities separated by a constant angle ω. In this case, when the controller detects the susceptor 800 at the home position 808, the controller determines that γ=0. The first symmetric non-uniformity 804 is located at front edge β and back edge α. The second symmetric non-uniformity 804 is located at front edge β+ω and back edge α+ω. The third symmetric non-uniformity 804 is located at front edge β+2ω and back edge α+2ω. If the controller determines that any of β, β+ω, or β+2ω is equal to ∂, the controller activates the directed energy source 150. If the controller determines that any of α, α+ω, or α+2ω equals ∂, the controller deactivates the directed energy source 150. In this way, a single signal feature 144 can be used, along with known positions of emitters and thermal non-uniformities and a programmed controller, to operate directed energy sources to compensate for thermal non-uniformities in processing.

It should be noted that the chamber may be programmed by used of signal features, signalers, and controllers operatively coupled to the power supplies of directed energy sources, as described above, or a pattern of operation may be programmed directly into the controller using software. The pattern of operation may be defined by analysis of the test substrates, as described above, so the chamber may be programmed without use of signal features, or the chamber programming may include both signal features and software to provide the desired pattern of operation.

Additionally, the directed energy sources, signal features, signalers, power supplies, and controllers described herein can be used with processing chambers having different types of substrate supports and energy modules for processing substrates. For example, conventional substrate supports may be used, including pedestal-style supports, ring-style supports, and hanging supports. In a pedestal-style support, energy may be provided by disposing heating elements, such as resistive heat elements, in the pedestal. The hanging support can use a susceptor, as described above, or a resistive heat support surface. Substrate supports for supporting a plurality of substrates can also be used. As exemplified in the embodiment of FIG. 6, two energy modules may be included in a processing chamber, with the substrate support between the two energy modules. Such configurations may be used for the processing chambers 100, 300, and 400, of FIGS. 1, 3A, and 4A, in addition to the processing chamber 600 of FIG. 6. In each case, the directed energy sources may be positioned to direct energy through one of the energy modules to the substrate support.

While the foregoing is directed to embodiments of the present disclosure, other and further embodiments of the disclosure may be devised without departing from the basic scope thereof, and the scope thereof is determined by the claims that follow.

What is claimed is:

1. A processing chamber, comprising:
   an enclosure for a processing volume;

a rotatable support within the enclosure, the rotatable support having a shaft that extends outside the enclosure;

one or more signal features disposed on the shaft outside the enclosure;

an energy module within the enclosure, wherein the shaft extends through the energy module;

one or more directed energy sources coupled to the enclosure; and one or more signalers positioned proximate to the signal feature, the one or more signalers corresponding to at least one of the directed energy sources.

2. The processing chamber of claim 1, wherein the each of the one or more signal features is one or more reflective surfaces and a corresponding signaler includes an illuminator and an optical receiver.

3. The processing chamber of claim 2, wherein the illuminator is a laser and the optical receiver is a photodiode circuit.

4. The processing chamber of claim 1, wherein the one or more directed energy sources include a collimator attached to an opening in the enclosure, a laser fiber-coupled to the collimator, and a power source coupled to the laser.

5. The processing chamber of claim 4, wherein the one or more signalers are coupled to the power source.

6. The processing chamber of claim 4, wherein each of the one or more signal features is a protrusion extending from the shaft and the one or more signalers include a physical switch positioned to contact the protrusion as the rotatable support rotates.

7. The processing chamber of claim 6, wherein the physical switch energizes the power source.

8. The processing chamber of claim 1, wherein the one or more signal features comprises a plurality of reflective strips on the shaft.

9. The processing chamber of claim 8, further comprising a plurality of lift pins coupled to the rotatable support, each at an angular location, and the plurality of reflective strips are located on the shaft at the angular locations of the plurality of lift pins.

10. The processing chamber of claim 1, wherein the one or more directed energy sources is a plurality of directed energy sources, the one or more signalers is a plurality of signalers, and each signaler is coupled to a corresponding one of the one or more directed energy sources.

11. The processing chamber of claim 10, wherein each of the one or more signal features includes a plurality of signal elements and each of the one or more signalers is positioned proximate to a corresponding signal element.

12. A processing chamber, comprising:
an enclosure for a processing volume;
a rotatable support within the enclosure, the rotatable support having a shaft that extends outside the enclosure,
an energy module within the enclosure, wherein the shaft extends through the energy module;
a rotation actuator coupled to the shaft;
a directed energy source coupled to the enclosure;
a controller coupled to the rotation actuator and the directed energy source, the controller configured to synchronize rotation of the rotatable support with operation of the directed energy source;
a signaler coupled to the controller; and
a plurality of signal features disposed on the shaft and grouped into a plurality of groups, the plurality of signal features operatively coupled to the signaler.

13. The processing chamber of claim 12, wherein the directed energy source includes a radiation source coupled to a power source, and the controller is configured to energize the power source.

14. The processing chamber of claim 13, wherein the radiation source is a laser.

15. The processing chamber of claim 14, wherein the laser is fiber-coupled to a collimator, which is coupled to the enclosure.

16. The processing chamber of claim 12, wherein the controller is configured to synchronize rotation of the rotatable support with operation of the directed energy source based on systematic processing non-uniformities resulting from operation of the processing chamber.

17. The processing chamber of claim 12, wherein the controller is configured to synchronize rotation of the rotatable support with operation of the directed energy source based on signals from the signaler triggered by the plurality of signal features.

18. A processing chamber, comprising:
an enclosure for a processing volume;
a rotatable support within the enclosure, the rotatable support having a shaft that extends outside the enclosure;
a plurality of signal features disposed on the shaft;
an energy module within the enclosure, wherein the shaft extends through the energy module;
one or more directed energy sources coupled to the enclosure;
one or more signalers positioned proximate to the signal features, the one or more signalers operatively coupled to one or more of the plurality of signal features; and
a controller coupled to the one or more signalers and to the one or more directed energy sources.

19. The processing chamber of claim 18, wherein at least one of the plurality of signal features is a reflective portion of the shaft and at least one of the one or more signalers includes an optical emitter and optical detector both optically coupled to the reflective portion.

20. The processing chamber of claim 18, wherein the each of the one or more directed energy sources includes a radiation source coupled to a power source, and the controller is configured to energize the power source.

* * * * *